321-93 SR

10/19/82 XR 4,355,286

United States Patent [19]

Knobbe et al.

[11] 4,355,286

[45] Oct. 19, 1982

[54] RESONANT CIRCUIT ARRANGEMENT

[75] Inventors: Karl-Heinz Knobbe, Ellerbek; Hellmut Nöldge, Hamburg, both of Fed. Rep. of Germany

[73] Assignee: Herfurth GmbH, Fed. Rep. of Germany

[21] Appl. No.: 207,051

[22] Filed: Nov. 14, 1980

[30] Foreign Application Priority Data

Nov. 24, 1979 [DE] Fed. Rep. of Germany ....... 2947519

[51] Int. Cl.³ ........................... H03F 3/60; H03B 5/18

[52] U.S. Cl. ........................................ 330/56; 331/98

[58] Field of Search .................... 330/56, 54; 333/228; 331/97, 98

[56] References Cited

U.S. PATENT DOCUMENTS 2,568,727 9/1951 Freeman .............................. 331/98

*Primary Examiner*—James B. Mullins
*Assistant Examiner*—Gene Wan
*Attorney, Agent, or Firm*—Beveridge, De Grandi & Kline

[57] ABSTRACT

A resonant circuit arrangement for anode resonant circuits in radio frequency output amplifiers. A transmitter tube is formed with a cylindrical grid electrode and, coaxial therewith, a hollow cylindrical anode member encircling the grid electrode. A first circular metal disk extends perpendicularly from the grid electrode beyond the anode member. A second circular metal disk, with a smaller external diameter than the first, extends perpendicularly from the outer surface of the anode member. A hollow metal cylinder extends from the peripheral edge of the first circular metal disk past the second circular metal disk. A third circular metal disk extends from the hollow metal cylinder parallel with the first and second circular metal disks and on the side of the second disk opposite the first disk. A fourth circular metal disk is positioned between and parallel to the third and fourth disks. The fourth disk has an external diameter less than that of the first and third disks, and the third and fourth disks have internal diameters greater than the external diameter of the hollow cylindrical anode electrode. A cylindrical metal wall interconnects the internal edges of the third and fourth metal disks. A plurality of isolating capacitors are coupled between the outer edges of the second and third disks and so are electrically coupled to the cylindrical grid electrode.

10 Claims, 9 Drawing Figures

$$l_1+l_2+l_3=\frac{3\lambda}{4}$$

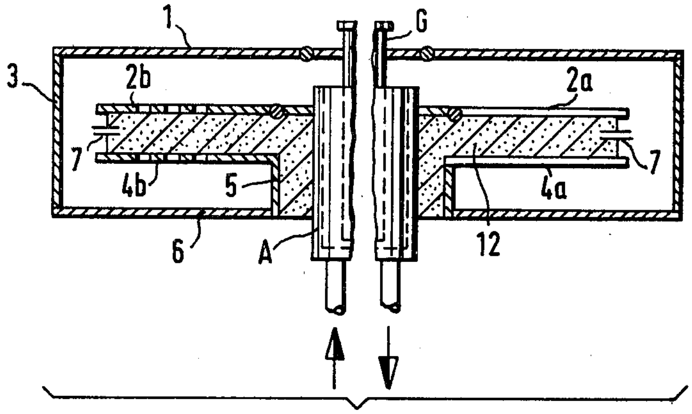
FIG. 2
FIG. 3A
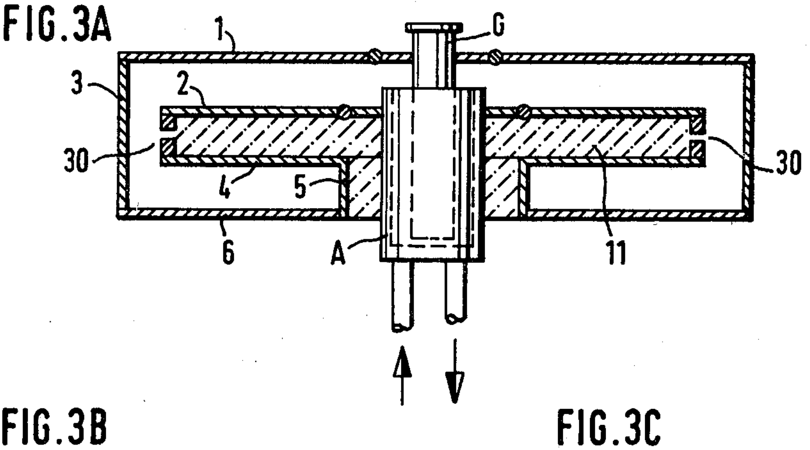
FIG. 3B
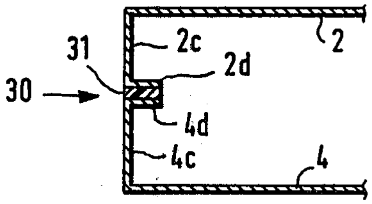
FIG. 3C
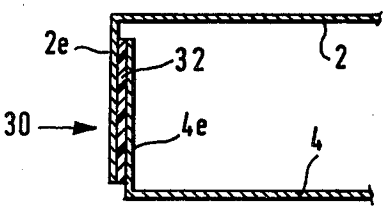
FIG. 3D
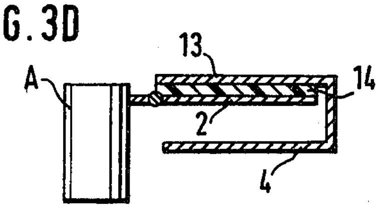
FIG. 3E
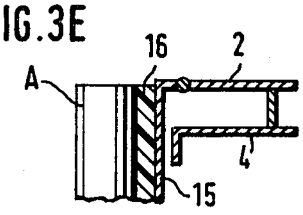

RESONANT CIRCUIT ARRANGEMENT

BACKGROUND OF THE INVENTION

The invention relates to a resonant circuit arrangement for anode resonant circuits in transmitter-output amplifiers of high frequency and high radio-frequency power output with a coaxial triode or tetrode as the transmitter tube.

The resonant circuit arrangement according to the invention is particularly advantageous in the frequency range of approximately 50 to 200 MHz and for a power output of 200 kW to approximately 2 MW, where the design of anode resonant circuits has hitherto encountered numerous technical problems.

Thus, one difficulty was that very large transmitter tubes were required for the aforementioned transmitter outputs and for the aforementioned frequencies even had to be structures which can resonate in the form of coaxial line portions coming close to the quarter-wave length resonance. Thus, e.g. a transmitter tube able to supply a 2 MW radio-frequency power at an operating frequency of approximately 100 MHz has a short-circuit resonance (quarterwave length resonance) at a frequency of 105 MHz. To obtain an effective energy disconnection at this frequency it is necessary to have at least a $\lambda/2$ structure as the external resonant circuit.

A further problem has involved the isolating capacitor in the anode circuit where, in the case of the parallel feed-in of the d.c. input power used here the feed-in point is at earth potential. Due to the fact that there are d.c. voltages of up to 25 kV at the capacitor and also radio-frequency currents can flow through it, it is exposed to considerable loads and is consequently a particularly critical components.

An attempt could be made to solve the aforementioned problems in that the line portion formed by the coaxial arrangement of the cylindrical anode and the cylindrical grid electrode of the tube is extended by a corresponding, externally fitted, coaxial conductor arrangement in such a way that the overall arrangement formed by the transmitter tube and the extension piece forms a $\lambda/2$ line portion. If the cylindrical anode member and its extension is insulated from the remainder of the structure, it can be exposed to the full anode d.c. voltage, which is however, superimposed on the radio-frequency a.c. voltage of the anode circuit. Due to the high voltage formed between the inner and outer conductors of this $\lambda/2$ line formed from the transmitter tube and the coaxial extension, it is necessary to make certain requirements regarding the distance between the inner and outer conductors as concerns the minimum diameter d of the inner conductor and the diameter D of the outer conductor. If possible and in view of the dielectric strength of the arrangement, a ratio of $D/d \approx e = 2.718$ is preferably chosen. However, this leads, in accordance with the relationship $Z_o = 13810\ g_{10}(D/d)$, to a correspondingly high characteristic impedance $Z_o$ of the coaxial line system and consequently to disadvantageous matching conditions between transmitter tube and anode resonant circuit.

The characteristic impedance of the line portion formed by the tube is very low, because there can be a very small distance between the inner conductor (grid) and outer conductor (anode) due to the good insulation by the vacuum of the tube. A typical value is in this case 15 ohms. Under the conditions of air insulation, it would not be possible to extend the coaxial system for the same characteristic impedance, due to the high voltages present. On increasing the clearance, the characteristic impedance rises. However, the line current in the current loop, i.e. at the transition between the tube and the circuit, is determined by the a.c. voltage of the tube and the characteristic impedance of the tube system. Thus, this current also flows into the external system, where it causes in the voltage maximum a voltage as a product of the current and the characteristic impedance. This leads to a considerable transformation of the tube a.c. voltage to very high values.

As transmitter tubes of the aforementioned output powers are operated in water-cooled manner, particularly up to the boiling point, i.e. accompanied by steam formation, difficulties are also encountered in the arrangement of the cooling water pipes with respect to the inlet or output connections of the anode member constructed as a cavity for the head exchange and in which the coolant circulates. The limits for the dielectric strength of a system designed for these conditions are rapidly reached, so that preference is given to the insertion of an isolating capacitor between the anode and the inner conductor in order to keep the latter free from d.c. current. However, it is then necessary to use an especially designed isolating conductor with a particularly high-grade dielectric, because the entire resonant circuit current flows through the latter and this can reach several thousand amperes corresponding to the transmitter output and the resonant circuit quality.

In order to obtain improved matching conditions, it is also possible to extend the anode resonant formed from the coaxial conductor arrangement of transmitter tube and extension piece to $1 = 3\lambda/4$ ($\lambda$ being the operating wavelength). However, in this case it is not possible to obviate the use of the isolating capacitor.

Another way to form an anode resonant circuit is, for example, to design a cylindrical cavity resonator for the resonance with the $E_{010}$ wave mode. According to Meinke-Gundlach "Taschenbuch der Hochfrequenztechnik", 2nd edition, section G.7 such a cavity resonator is can-shaped, i.e. constructed as a flat can. If, for example, an operating frequency of 108 MHz is required, in the case of a $\lambda/2$ resonance of this cavity resonator, a diameter of 2.5 m is obtained for such a can, whose electrical length is extended by $\lambda/4$ by the coaxial line portion formed from the actual transmitter tube and is therefore increased to an electrical length of $3\lambda/4$. Thus, such an arrangement has a considerable space requirement and has a tendency to undesired interfering modes.

BRIEF SUMMARY OF THE INVENTION

The problem of the invention is to provide a resonant circuit arrangement of the aforementioned type offering an operationally reliable and high voltage-proof construction, accompanied by limited expenditure for the isolating capacitors and low space requirements.

The resonant circuit proposed for solving the set problem forms the subject matter of the main claim. It provides a particularly compact construction with good accessibility for the voltage and coolant supply without undesirable interfering modes, whilst the isolating capacitor can be operated in a substantially radio-frequency current-free manner.

According to a feature of the invention, the gap for suppressing coupled-in interfering modes is wholly or partly filled with an absorptive material, such as e.g.

resistance, ferrite or graphite material. These interfering modes can then be coupled-in in the vicinity of the isolating capacitors if currents flow in the case of these interfering modes compared with the desired $E_{010}$ wave mode in this range.

According to another feature of the invention, the second and fourth circular disks have radially directed damping slots for suppression of interfering modes with line currents running concentrically or peripherally on these disks or concentrically directed damping slots for suppressing interfering modes with line currents running radially on said disks. Thus, interfering modes with undesired wave modes are coupled-out in the gap and are damped there by the absorptive material. As a result, undesired resonances are suppressed and it is ensured that inadmissible radio-frequency currents do not flow through the isolating capacitors.

According to another feature, the isolating capacitors can advantageously be constructed in such a way that on the circumferential areas of the second and fourth circular disks, edge areas are formed which are aligned with one another and are bend inwards in the form of flange-like electrodes of a circular isolating capacitor. A dielectric with a high dielectric constant and low losses is arranged between these electrodes. Alternatively, vertically directed edge areas of the second and fourth circular disks overlap one another substantially for forming the annular isolating capacitor, the aforementioned dielectric being inserted between them.

As stated hereinbefore, it is already known to produce disk-like anode resonance circuits in the form of cavity resonators with an electrical length corresponding to a quarter-wave length at the operating frequency and with a voltage maximum in the centre of the disk, whilst the current loop is positioned at the edge of the disk. If such a resonator was centrally provided with a coaxial transmitter tube, the electrical quarter-wave length would be much longer than the actual resonator alone. However, the coaxial line portion with the size of a quarter-wave length formed by the transmitter tube would give overall a resonant circuit arrangement with the electrical length of a half-wave at the operating frequency on eliminating the short-circuit between the two disks at the edges thereof. in the case of resonance, the voltage maximum would then be located at the edge of the disk arrangement.

Due to the constantly increasing surface area in the radially outwards direction due to the inductance per unit length and rising capacitance per unit length the characteristic impedance of such a disk-like, rotationally symmetrical structure continuously decreases radially from the inside to the outside and is considerably lower than for a coaxial conductor structure with the same conductor spacing on which TEM waves are formed. Thus, the voltage transformation problems no longer occur.

Due to the transition from the coaxial line portion, which encloses the transmitter tube and on which the TEM waves are formed, to the disk structure within which hollow guide waves of the TEM or TE type ($E_{mnp}$ or $H_{nmp}$ waves) can form, particular attention must be paid to the space surrounding the disk structure due to the mode conversions and transformations of the impedance or the radio-frequency voltage at the transitions. It is fundamentally possible to greatly reduce the influence of the space surrounding the structure by fitting rotationally symmetrical $\lambda/4$ ditches in the edge area of the disk structure, in much the same way as they are provided in the peripheral area of microwave oven doors for the contactless sealing of the interior of the oven acting as a cavity resonator with respect to the outside. However, the disadvantage is that such a $\lambda/4$ ditch must be matched very accurately to the operating frequency of the resonant circuit arrangement with the electrical length $\lambda/2$, i.e. such an arrangement is particularly sensitive to frequency. The resonant circuit arrangement according to the invention also eliminates this problem.

BRIEF DESCRIPTION OF THE DRAWINGS

The invention is described in greater detail hereinafter relative to non-limitative embodiments and the attached drawings, wherein:

FIG. 2 a lateral part sectional view of another embodiment of a resonant circuit arrangement according to the invention, which is particularly suitable for suppressing interfering modes.

FIG. 3A a lateral part sectional view of another embodiment of the resonant circuit arrangement with an annular isolating capacitor arranged along the separating line of the two circumferential edges of the two inner circular disks of the conductor system.

FIGS. 3B and C are two larger-scale, diagrammatic sectional views of two embodiments of the annular isolating capacitor of FIG. 3A.

FIGS. 3E and F are sectional views of two further embodiments.

DETAILED DESCRIPTION OF THE PREFERRED EMBODIMENTS

Figure 1A:
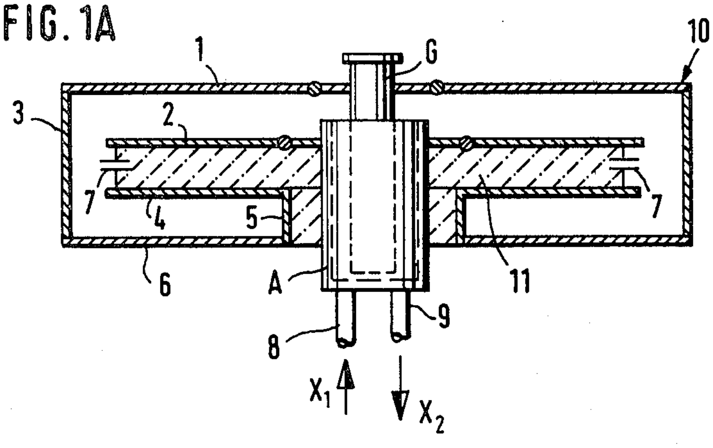
FIG. 1A a lateral part sectional view of the resonant circuit arrangement according to the invention, including a coaxially constructed transmitter tube, which can be in the form of a triode or tetrode.

The anode resonant circuit arrangement according to the invention is shown in FIG. 1 as 10. A transmitter tube with a high power output, typically between 200 kW and 2 MW for operating frequencies between 50 and 200 MHz is in the form of a coaxial tetrode or triode with an outer, double-walled hollow cylindrical anode member A through which flows a coolant and an also hollow cylindrical grid electrode G arranged concentrically thereto and is surrounded by an outer resonant circuit structure. A flowing medium, e.g. water flows via an intake connection at 8 and a discharge connection at 9 in the direction of two arrows $X_1$ and $X_2$ for cooling the transmitter tube by removing the dissipated heat.

A first circular, metal disk 1 concentrically surrounds the hollow cylindrical grid electrode G projecting out of the anode member A, whilst forming a good conductive contact and extends perpendicularly to the longitudinal axis of the transmitter tube.

A second circular, metal disk 2 faces the first circular, metal disk 1 and extends parallel thereto. Disk 2 has a smaller external diameter than disk 1 and is connected to the outer surface of anode member 1, whilst forming a good conducting contact. A hollow cylindrical, metal covering 3 is joined to the entire circumferential edge of the first circular disk 1 and at its lower edge passes into a third circular disk 6, parallel to circular disks 1 and 2 and having a central, circular recess, from which extends upwards a cylindrical wall 5 parallel to the outer surface of anode member A. A fourth circular disk 4 is linked with the upper edge of the cylindrical wall 5 and is parallel to circular disks 1 and 2. The external diameter of disk 4 is the same as that of the disk 2. Between the outer circumferential areas of the second and fourth disks 2 and 4 and distributed over the circumference thereof are connected isolating capacitors 7, forming a radio-frequency link between said two disks. All the remaining connections between the elements of this structure have a particularly good metal conductivity. The metal can be copper, aluminium or brass and the surfaces carrying the radio-frequency currents can be silver coated in conventional manner to obtain a particularly good conductivity and therefore a particularly limited penetration depth of said currents.

Figure 1B:
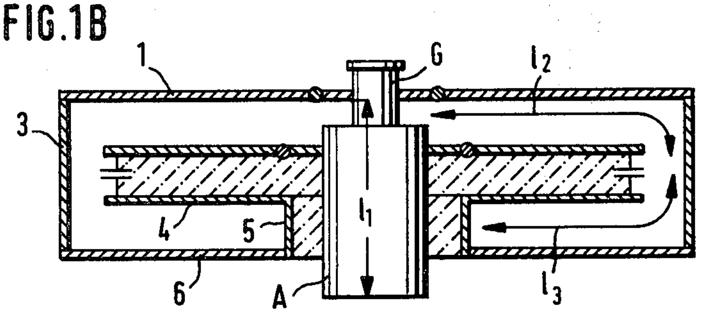
FIG. 1B a lateral part sectional view of the resonant circuit arrangement, as in FIG. 1A for illustrating the position of the different line portions which together form the resonant circuit according to the invention.

According to FIGS. 1A and 1B the circular disks 1 and 6 form an external, can-shaped structure of the type encountered with conventional, cylindrical cavity resonators (cf particularly Meinke-Gundlach "Taschenbuch der Hochfrequenztechnik", 2nd edition, sections D, G and O). Between the first and second circular disks 1 and 2 is provided an upper, rotationally symmetrical, disk-like cavity which, in the vicinity of covering 3, passes into a short hollow cylinder and then directed inwards towards the longitudinal axis of the transmitter tube into a lower, rotationally symmetrical, disk-like cavity formed by disks 4 and 6 and terminated by cylindrical wall 5 in an end area directed towards the centre of the structure. Between the circular disks 2 and 4, the outer surface of anode member A and, bounded by the isolating capacitors 7 arranged on the circumferential area of disks 2 and 4 a substantially field-free gap 11 is formed which is accessible from the outside by recesses in the third and fourth circular disks 6 and 4. It is shown hatched in FIG. 1A and FIG. 1B and will be described in greater detail hereinafter.

FIG. 1B more particularly serves to illustrate the line portions from which the anode resonant circuit arrangement 10 according to the invention is formed.

The first line portion $l_1$ is formed by the coaxial arrangement of grid electrode G and anode member A of the transmitter tube. At the lower terminal area where the cylinder grid electrode penetrates deepest into the anode member A line portion $l_1$, on which TEM waves are propagated, is open, so that in accordance with the current and voltage distribution I(l) and U(l) shown in FIG. 1C a voltage maximum and a simultaneous current minimum or a voltage loop and a current node is formed at $l_1$ to the far left of this diagram.

The second line portion $l_2$ is the disk-shaped cavity resonator formed by the circular disks 1 and 2 and the upper part of covering 3 and in which the hollow waveguide waves of the $E_{010}$ mode are formed. It is particularly advantageous in view of the obtainable adaptation that the characteristic impedance for this wave mode decreases rapidly radially from the inside to the outside starting from the transmitter tube. Thus, at the transition points between $l_1$ and $l_2$, i.e. from the transmitter tube to the first part of the outer anode resonator circuit there is a particularly advantageous adaptation and at the other transition where the second line portion $l_2$ passes into the third line portion $l_3$ there is an equally advantageous adaptation.

An important prerequisite for the satisfactory operation of the resonant circuit arrangement is that all three line portions $l_1$, $l_2$ and $l_3$ have the electrical lengths $\lambda/4$ giving, as can be seen in FIG. 1B, an overall line length of $$l_1+l_2+l_3=3\lambda/4 \quad (1)$$

Figure 1C:
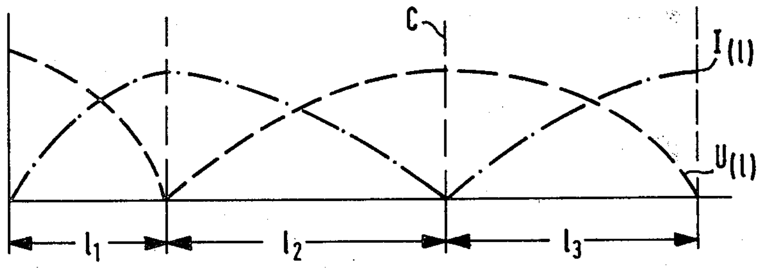
FIG. 1C a diagram for the illustration of the current and voltage distribution along the three line portion shown in FIG. 1B.

Due to the different course of the inductance and capacitance per unit length in the three line portions the geometrical lengths $l_1$, $l_2$ and $l_3$ are not the same, as is apparent from FIGS. 1A and 1B and paticularly FIG. 1C. Thus, e.g. length $l_1$ can be much shorter than $\lambda/4$.

Thus, assuming that each of the line portions $l_1$, $l_2$ and $l_3$ has the electrical length of a quarterwave length at the operating frequency, the cument and voltage distribution I(l) and U(l) shown in FIG. 1C is obtained over the individual line portions $l_1$, $l_2$ and $l_3$ for the resonant circuit arrangement 10. Thus, at the transition from the coaxial line portion $l_1$ formed by grid electrode G and anode member A, i.e. the actual transmitter tube to the disk-like, rotationally symmetrical line portion $l_2$ formed from the circular disks 1 and 2 there is a current maximum and a voltage minimum or a current loop and a voltage node, whilst at the externally positioned transition of the upper line portion $l_2$ to the lower disk-like rotationally symmetrical line portion $l_3$ formed from the circular disks 4 and 6 in the vicinity between covering 3 and isolating capacitor 7 there is a current minimum and a voltage maximum.

This transition between the line portions $l_2$ and $l_3$, designated as C in FIG. 1C is consequently particularly suitable for applying isolating capacitors 7, because there is a current minimum here when the $E_{010}$ wave occurs and consequently the current load of the isolating capacitor 7 is particularly low at this point.

According to the invention, it is particularly advantageous that the third line portion $l_3$ is folded towards the centre of the arrangement and retracted. If, as hitherto, both line portions $l_2$ and $l_3$ were combined into a single disk-like, rotationally symmetrical $\lambda/2$ line portions formed from the two circular disks outside the transmitter tube acting as a $\lambda/4$ line portion at the operating frequency, such a disk-like $\lambda/2$ line portion would have an external diameter of 2.5 m for an operating frequency of 108 MHz and would therefore be very expensive. In addition, in such a large resonant cavity arrangement formed from two circular disks interfering modes of the $E_{nmp}$ wave type would occur in addition to the desired $E_{010}$ wave, because the cut-off frequency for such interfering modes would be correspondingly lower. As a result of the form selected according to the invention with a cavity resonator of length $l_3$ at quarter-wave resonance, terminated by a short-circuit at 5 and led back towards the centre again, the cut-off frequencies of the intefering modes of the $E_{nmp}$ wave type are higher than the operating frequency at which the desired $E_{010}$ wave according to FIG. 1C and equation (1) is formed.

Another disadvantage of a $\lambda/2$ cavity resonator formed from two circular disks is in the high irradiation at the open circumferential area between the two disks. If a $\lambda/4$ ditch formed with an additional disk is introduced into this area it is possible to eliminate some of the difficulties occurring on the circumferential edge of such an open cavity resonator structure, particularly due to an impedance or voltage transformation. Furthermore, such an arrangement is only adjusted for a precisely defined operating frequency, i.e. is particularly frequency-sensitive. If a screen case is placed around such a structure to prevent external influences, the overall arrangement remains very sensitive to frequency, particularly due to the λ/4 ditch which must be accurately matched or adjusted.

As is apparent from FIGS. 1A and 1B, grid electrode G is directly connected to disk 1, covering 3, lower disk 6, inner wall 5 and lower inner disk 4. The second disk 2 carries the d.c. voltage potential as is also present on the anode member A of the transmitter tube. Due to the isolating capacitors arranged in the current-free zone (at C according to FIG. 1C) on the outer circumferential area of the second and third disks 2 and 4 the latter are interconnected in radio-frequency manner. Depending on the characteristics of the remaining gap between the isolating capacitors 7 and the impedance at this transition, a certain part of the energy from the cavity resonator $l_1$-$l_2$-$l_3$ can be coupled into the field-free gap 11 (according to FIG. 1A, particularly in the case of interfering modes differing from the desired $E_{010}$ wave type. It is therefore advantageous to wholly or partly fill this gap, as shown in FIG. 2, with an absorptive material 12, e.g. resistance, ferrite or graphite material in order to make it field-free and suitable for housing the tubes for supplying and removing the coolant and the lead for applying the anode voltage. It is apparent that in the case of interfering modes of the $E_{nmp}$ or $H_{nmp}$ wave type (i.e. transverse-magnetic or transverse-electrical waves) currents occur in the transition region between the second and third disks 2 or 4 in radial or concentric manner with respect to the median axis of the resonant circuit arrangement 10, so that the interfering modes are preferably coupled into gap 11 with respect to the desired $E_{010}$ wave and converted into heat in the absorptive material 12 located therein.

According to FIG. 2, the coupling of the undesired interfering modes from line system $l_2$-$l_3$ into the absorptive material 12 in gap 11 can be aided by providing damping slots in the circular disks 2 and 4 in such a way that these interfering modes are substantially suppressed in the actual anode resonant circuit $l_2$-$l_3$. If it is a question of suppressing interfering modes with line currents flowing concentrically in disks 2 and 4 parallel to the circumferential edge, in the manner shown by slots 2*a* and 4*a* in FIG. 2 said damping slots are arranged radially with the necessary length and width for damping the interfering modes, but whilst impairing to the minimum the formation of the $E_{010}$ wave or whilst reducing to a minimum the operating quality for this wave. Such damping slots are arranged concentrically for interfering modes with radially directed line currents in disks 2, 4. Here again, the influence on the $E_{010}$ wave and the operating quality is to be kept to a minimum. The concentrically arranged damping slots in disks 2 and 4 are indicated at 2*b* and 4*b* in FIG. 2.

As stated hereinbefore, interfering modes in the vicinity of the isolating capacitor 7 can be coupled into gap 11 (FIG. 1A). FIGS. 3A, B and C show how this danger can be removed by an improved design of the isolating capacitor. As is shown in general form in FIG. 3A, the circumferential edge of the disks 2 and 4 can be bent over, so that over the entire disks circumference at 30 two electrodes or coatings of an annular isolating capacitor are formed between which a high-grade dielectric can be inserted in annular or strip-like manner.

According to an embodiment shown in FIG. 3B, vertically directed edge areas 2*c*, 4*c* are formed in the circumferential areas of the circular disks 2 and 4 and are aligned with one another, being bent inwards in accordance with an annular isolating capacitor 30 constructed in the form of flange-like electrodes 2*d*, 4*d* for increasing the capacitance. Between these electrodes 2*d*, 4*d* it is possible to insert a dielectric 31 with a high dielectric constant and low losses.

According to another embodiment illustrated in FIG. 3C, the vertically directed edge potions 2*e*, 4 *e* of the circular disks 2 and 4 considerably overlap one another to form the annular isolating capacitor 30. A dielectric 32 can be positioned between them. This arrangement has the advantage of being particularly well sealed for interfering modes of all types, because the overlapping area at 2*e*, 4*e* represents a hollow waveguide section operated at below the relevant cut-off frequency and which suppresses the interfering modes.

The coupling-out of energy from the cavity resonator according to the invention can be carried out in several ways, e.g. directly or galvanically between the second and fourth disks 2 and 4, capacitively towards the inner disks 2, 4 or via a conventional coupling loop in mixed capacitive-inductive form or via a probe extended as a coaxial line.

Such an anode resonance circuit arrangement with a transmitter tube with a high power output can be used in radio-frequency drying, welding and diathermy installations, as well as in communications and navigation transmitters and particle acceleration plants to mention only a few possible applications. Thus, in the case of an acceleration plant, a plurality of transmitter amplifiers constructed according to the invention are connected to the actual acceleration structure by means of coaxial radio-frequency lines.

For the use of the anode resonant circuit according to the invention, it is possible to use transmitter amplifiers with triodes or tetrodes having a coaxial construction. When using triodes, it is preferable to employ a grounded-grid circuit in which the grid electrode is at earth potential. As in the case of tetrodes, the screen is also at earth potential from the radio-frequency standpoint, such a transmitter amplifier can be operated in both a grounded grid circuit and a grounded cathode circuit.

Other modifications can be made to the aforementioned embodiments of the anode resonant circuit and the connection between the transmitter tube and the outer resonator and with regard to the coupling-out of the radio-frequency energy without passing beyond the scope of the invention.

Thus, e.g. according to an embodiment of the isolating capacitor according to FIG. 3D, a fifth metal disk 13 can be inserted parallel to the second disk 2 connected to anode member A which extends parallel to the latter and covers the latter with respect to the first metal disk 1. The second and fifth metal disks 2 and 13 respectively then form the coatings of the isolating capacitor, between which there is an insulation 14 with a high dielectric strength and high dielectric constant. The fifth disk 13 is directly connected to the fourth disk 4.

In the case of the embodiment of FIG. 3A, a tubular isolating capacitor is formed from the anode member A, an inserted insulation 16 with a high dielectric strength and constant and a metal tube 15 arranged concentrically to anode member A. In this case, the outer peripheral edges of the second and fourth metal disks 2 and 4 respectively are directly interconnected and together with covering 3 and the first disk 1 are at earth potential.

What is claimed is:

1. A resonant circuit arrangement for anode resonant circuits in output amplifiers of transmitters of high frequency and high radio-frequency power output comprising:

(a) a transmitter tube having a cylindrical grid electrode and coaxial therewith a hollow cylindrical anode member encircling the grid electrode to form therewith a coaxial line portion open at one end thereof;

(b) a first circular metal disk surrounding the grid electrode and in electrically conducting contact therewith, and extending perpendicularly with respect to the axis of the transmitter tube beyond the hollow cylindrical anode member;

(c) a second circular metal disk having a smaller external diameter than the first disk and arranged parallel thereto, and connected to the outer surface of the anode member in electrically conducting contact therewith;

(d) a hollow cylindrical metal covering connected to the peripheral edge of the first circular disk and extending beyond the second circular disk;

(e) a third circular metal disk connected to the cylindrical metal covering, on the side of the second metal disk opposite the first metal disk and parallel thereto, and having an internal diameter greater than the diameter of the hollow cylindrical anode member;

(f) a fourth circular metal disk between the second and third circular metal disks and parallel thereto, and having an internal diameter greater than the diameter of the hollow cylindrical anode member and an external diameter smaller than the external diameter of the third circular metal disk;

(g) a cylindrical metal wall interconnecting the third and fourth circular metal disks at the internal edges thereof;

(h) a plurality of isolating capacitors coupled between the outer edge of the second circular metal disk and the outer edge of the third circular metal disk and electrically connected through the fourth circular metal disk, the cylindrical metal wall, the third circular metal disk, the hollow cylindrical metal covering and the first circular metal disk to the cylindrical grid electrode;

whereby a disk-like, rotationally symmetrical line portion is formed between the first and second circular metal disks, terminating in a transition zone formed between the hollow cylindrical metal covering and the external edge area of the second circular metal disk, and a second disk-like rotationally symmetrical line portion is formed extending from the transition zone inwardly toward the center of the resonant circuit arrangement with an electrical length of a quarter-wavelength at the operating frequency of the resonant circuit arrangement, so that a current minimum is formed in the transition area between the first and second line portions in the case of the $E_{010}$ wave mode occurring in said line portions, and in the area between the outer surface of the hollow cylindrical anode member, the second circular metal disk, the isolating capacitors, the fourth circular disk, and the cylindrical metal wall a substantially field-free gap is formed accessible through the area between the internal edges of the third and fourth circular metal disks and the outer surface of the hollow cylindrical anode member.

2. A resonant circuit arrangement as claimed in claim 1 further comprising an absorptive material within said substantially field-free gap.

3. A resonant circuit arrangement as claimed in claim 2 in which said absorptive material is a ferrite material.

4. A resonant circuit arrangement as claimed in claim 2 in which said absorptive material is a graphite material.

5. A resonant circuit arrangement according to claim 1 or 2 wherein the second and fourth circular disks have radially directed damping slots therethrough for suppressing interfering modes with line currents running concentrically on said disks.

6. A resonant circuit arrangement according to claim 1 or 2 wherein the second and fourth circular disks have concentrically directed damping slots therethrough for suppressing interfering modes with line currents running radially on said disks.

7. A resonant circuit arrangement according to claim 1, wherein the external circumferential edge areas of the second and fourth circular disks are aligned with one another and are bent over inwards to form flange-like electrodes of an annular isolating capacitor; and said arrangement further comprising a dielectric having a high dielectric constant and low losses between said electrodes.

8. A resonant circuit arrangement according to claim 1 wherein the external circumferential edge areas of the second and fourth circular disks are bent over to overlap one another to form an annular isolating capacitor; and said arrangement further comprises a dielectric having a high dielectric constant and low losses between the bent over edge areas.

9. A resonant circuit arrangement according to claim 1 further comprising a fifth circular metal disk between the first circular metal disk and the second disk; a further cylindrical metal member connecting the external peripheral edge of the fifth circular metal disk to the peripheral edge of the fourth disk; and an insulation having a high dielectric strength and a high dielectric constant between the second and the fifth disks.

10. A resonant circuit arrangement according to claim 1 further comprising a tubular isolating capacitor between the second circular metal disk and the hollow cylindrical anode member, and a further cylindrical metal member interconnecting the outer circumferential edges of the second and the fourth circular metal disks.

* * * * *